SEMICONDUCTOR DEVICE AND METHOD OF MAKING SAME

Filed Oct. 1, 1956

MILTON BECKER,
MELVIN CUTLER,
JOHN R. GLIESSMAN,
INVENTORS

BY [signature]

ATTORNEY

1

3,001,894

SEMICONDUCTOR DEVICE AND METHOD OF MAKING SAME

Milton Becker, Melvin Cutler, and John R. Gliessman, Los Angeles, Calif., assignors to Hughes Aircraft Company, Culver City, Calif., a corporation of Delaware Filed Oct. 1, 1956, Ser. No. 613,102
10 Claims. (Cl. 148—1.5)

This invention relates generally to semiconductor devices and, more particularly, to fast recovery time semiconductor bodies and methods of making same. For definitions of terms used in the following specifications and claims, reference may be had to U.S. Patent No. 2,736,847 entitled, "Fused-Junction Silicon Bodies," issued to S. H. Barnes on February 28, 1956, and to Proceedings of the I.R.E., October 1954, pages 1506–1508.

In the prior art there has been a need for a fast recovery time semiconductor device, particularly a diode. This need has been felt most severely in such fields as those utilizing digital computers. In order to satisfy this need in the art, such devices have been constructed in the past by forming a semiconductor junction diode by any one of the well-known methods whereby a highly doped region of one conductivity type is produced within a semiconductor body of opposite conductivity type. The regions produced have exhibited a relatively low resistivity, while the remainder of the semiconductor body has exhibited a relatively high resistivity as compared to that of the region.

It is well known that in order to have a fast recovery time for a semiconductor diode, it is necessary that the high resistivity region within the semiconductor body be as thin as possible. To accomplish this, therefore, after formation of the junction, the semiconductor body was reduced in thickness by grinding, etching, lapping, or a combination of these processes in order to bring the face of the semiconductor body opposing the region as close to the P-N junction within the semiconductor body as possible.

The prior art methods resulted in a semiconductor body having recovery times of 2–5 microseconds. However, when the body was made extremely thin, on the order of one mil thick, the recovery time could be reduced to one microsecond, but because of the extremely thin bodies they were exceedingly fragile. This, in turn, created many difficult problems in the production of devices employing these thin semiconductor bodies.

It is accordingly an object of the present invention to provide a semiconductor body for use in semiconductor devices and which has a thin high resistivity region, while maintaining a substantial thickness of the semiconductor body.

Another object of the present invention is to provide an improved fused junction semiconductor diode having a thin regrown region of high resistivity, thus providing for a fast recovery time characteristic.

A further object of the present invention is to provide an improved method of producing semiconductor bodies having thin high resistivity regions.

A still further object of the present invention is to provide an improved method of producing semiconductor bodies which results in reproducible and controllably thin, high resistivity regions in the semiconductor body.

Still another object of the present invention is to provide an improved method of producing fused junction semiconductor bodies having reproductible regrown regions therein of minimum thickness which, in turn, provides semiconductor devices having fast recovery times.

In accordance with the method of the present invention, an active impurity-doped semiconductor body is prepared having atoms of at least two active impurities therein which are of opposite conductivity determining types, and have different segregation constants. A specimen of substantially pure non-doping solvent metal is then deposited upon at least one surface of the semiconductor body. The combination is then fused at a temperature above the eutectic temperature of the solvent metal and the semiconductor body, but below the melting point of the semiconductor body, and then cooled to form a regrown region within the body.

2

By following the method of this invention, there is produced a semiconductor body of one conductivity type having therein a regrown region of the opposite conductivity type, the regrown region having a high resistivity as compared to the semiconductor body, and having attached thereto a metal button of substantially pure solvent metal but containing a predominance of atoms of that active impurity found in the semiconductor body possessing the lowest numerical segregation constant.

The novel features which are believed to be characteristic of the present invention both as to its organization and method of operation, together with further objects and advantages thereof, will be better understood from the following description considered in connection with the accompanying drawing in which one embodiment of the invention is illustrated by way of example, and in which.

In the following description of one embodiment of the present invention, N-type germanium is chosen as the semiconductor wafer material for purposes of description only. It is, however, to be expressly understood that any semiconductor material may be utilized and may be of either N or P conductivity type. Some examples of semiconductor materials other than germanium which may be utilized are silicon, germanium-silicon alloy, indium-antimonide, aluminum-antimonide, gallium-antimonide, indium-arsenite, aluminum-arsenite, gallium-arsenite, lead-sulphide, lead-telluride, lead-selinide, cadmium-sulphide, cadmium-telluride, cadmium-selinide, as well as other semiconductor crystals.

Figure 1:
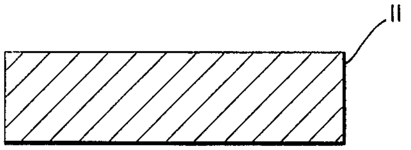
FIG. 1 is a schematic cross-sectional view of a semiconductor body prepared in accordance with the present invention.
Figure 2:
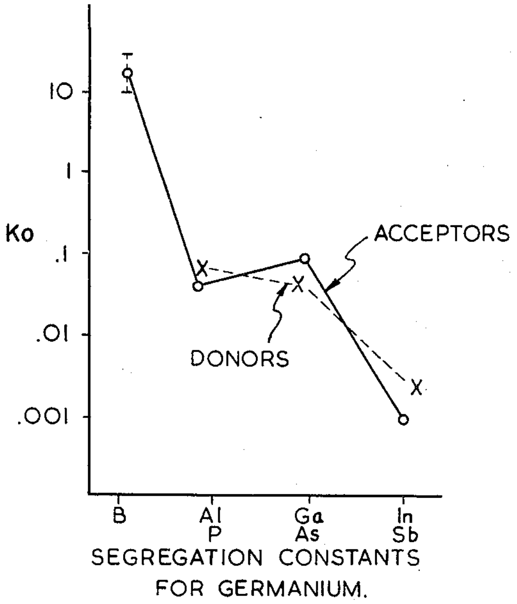
FIG. 2 is a graph illustrating segregation constants for germanium.

Referring now to the drawing and, more particularly, to FIG. 1 thereof, there is shown a semiconductor crystal body 11 containing at least two active impurities chosen to have the desired segregation constants. Segregation constants for various active impurities in germanium are illustrated by the graph of FIG. 2 to which reference is now made. The abscissa of the graph of FIG. 2 represents the active impurities, both donor and acceptor type, while the ordinate represents the segregation constant, sometimes referred to as $k_0$. A segregation constant may be defined as the ratio of the impurity content of the crystal in the solid to that of the melt in equilibrium with it for vanishingly small amounts of the impurity.

It will be seen by reference to the graph of FIG. 2 that the acceptor impurity boron has the largest numerical segregation constant, 10.0. This signifies that the content of the active impurity in the crystal, in the solid, and in the melt, is essentially equal. This would be the case with any active impurity having a segregation constant equal to one or greater. It will further be noted that the donor impurity antimony has the lowest segregation constant of the donor impurities, .001. This signifies that the concentration of the active impurity antimony in the solid will be .001 times the concentration in the melt. The segregation constants herein referred to, by way of example only, were measured during the growth of germanium crystals from the melt. Segregation constants of impurities in semiconductor bodies have not at this time been measured at the low temperatures at which the method of the present invention is carried out. It is believed, however, that the segregation constants herein referred to are relatively indicative of those which are encountered at the presently utilized temperatures.

For purposes of illustration only, it will be assumed that semiconductor body 11 of FIG. 1 is doped utilizing boron and antimony as the two active impurities and that antimony is predominant, thus resulting in an N-type body. A semiconductor body so prepared is sometimes referred to as being prepared by compensated doping. It will be noted that the two active impurities chosen, one being a donor and the other an acceptor, have widely separated segregation constants. While this is not necessary for purposes of the present invention, these impurities are so chosen for purposes of clarity of discussion. It will be understood that other donor and acceptor impurities may be utilized so long as the segregation constants thereof are separated substantially.

Figure 3:
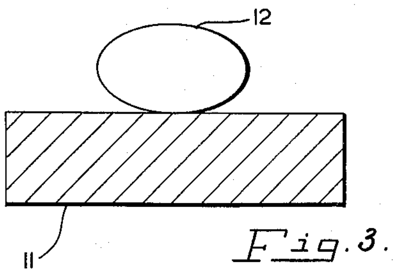
FIG. 3 is a cross-sectional view of a semiconductor body just prior to the fusion operation in accordance with the method of the present invention.

Referring now to FIG. 3, there is shown the semiconductor body 11 having disposed thereon a specimen of non-doping solvent metal 12. The type of solvent metal shown is not critical and may be any recognized non-doping solvent metal presently utilized in the prior art, some examples of which are gold, lead, and tin. It is, however, extremely critical that the solvent metal chosen be in its substantially pure state. By "substantially pure," it is meant that the solvent metal as utilized will not dope the semiconductor body in any manner that will vary its electrical characteristics. In the presently preferred embodiment of this invention pure gold was utilized as the solvent metal specimen 12.

After deposition of the solvent metal 12 upon the semiconductor body 11, the combination is raised to a temperature above the eutectic temperature of the semiconductor body 11 and solvent metal 12 but below the melting point of the semiconductor body 11. The deposition of the solvent metal and the heating of the body may be accomplished by any of the means presently known to the prior art, such as vapor deposition in a vacuum upon the heated body. Further examples of deposition and heating may be had by reference to Patent No. 2,736,847 entitled, "Fused Junction Silicon Diodes," issued to S. H. Barnes et al., on April 17, 1956. As evidenced from these references and from the foregoing discussion, the manner in which the solvent metal contacts the semiconductor body 11 is unimportant so long as fusion between the two occurs.

Figure 4:
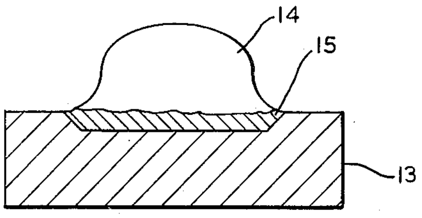
FIG. 4 is a cross-sectional view of a semiconductor body just after the fusion step has been carried out.

Referring now to FIG. 4, there is shown a semiconductor body 13 in cross section after the fusion step has been accomplished. Upon heating of the combination of the semiconductor body and the solvent metal specimen above the eutectic temperature thereof but below the melting point of the semiconductor body, the solvent metal wets the semiconductor body and dissolves or melts a portion thereof. After the dissolved portion of the semiconductor body and the molten portion of the solvent metal have substantially reached equilibrium, the combination is allowed to cool at a predetermined rate. Upon cooling, the dissolved portion of the semiconductor body, along with some of the atoms of the active impurities originally contained therein, regrows upon that portion of the body remaining in the solid, thus forming a regrown crystalline region within the semiconductor body 13 which is seen at 15. It is to be noted from the cross hatching utilized in FIG. 4 that the regrown region in the presently preferred embodiment of this invention has a conductivity opposite to that of the original semiconductor body 13. This difference in conductivity types is explained more fully below.

Assume that the original semiconductor body as shown in FIG. 1 had a concentration of acceptor atoms, boron, of $10^{15}$ per cubic centimeter and a concentration of donor atoms, antimony, of $1.5 \times 10^{16}$ per cubic centimeter. Upon formation of the eutectic between the solvent metal, gold, and the semiconductor body, germanium, the atoms of the donor and acceptor impurities present in that portion of the semiconductor body which was melted also go into the eutectic melt. During the subsequent cooling of the semiconductor body and the resulting precipitation of the semiconductor atoms along with the active impurity atoms, substantially all of the boron atoms present in the original semiconductor body and in the solution become a part of the regrown region since the segregation constant thereof is greater than one. However, the donor atoms of antimony are not all precipitated into the regrown region since the segregation constant of antimony is .001. This being the case, it is readily seen that only $1.5 \times 10^{13}$ atoms per cubic centimeter of antimony will be found in the regrown region formed by the above method. It is, therefore, seen that although the orginal crystal as selected and doped was an N-type crystal since it contained a predominance of donor type active impurity atoms, that is, antimony, that the regrown region is P-type since it contains a predominance of boron type acceptor active impurity atoms.

Once the regrown region has been formed, the gold button 14 remaining upon the semiconductor body may be utilized as a means for attaching a lead to the regrown region. Further a lead may be attached to the semiconductor body 13. These leads may be attached in any of the fashions presently known to the prior art, such as illustrated in Barnes, supra. When such is done the entire body may be encapsulated in a proper protective housing and utilized as a semiconductor diode.

A diode constructed in accordance with the present invention has a very fast recovery time. A recovery time for a semiconductor diode is defined as that time required for the current carriers to be cleared from the body after a forward biasing voltage is removed from the diode or is changed to a back biasing voltage. The recovery time of a diode constructed in accordance with the present invention is less than $\frac{1}{10}$ microsecond.

The fast recovery time present in a diode constructed in accordance with the present invention is a result of the fact that the regrown region is extremely thin and that this thin regrown region may be accurately controlled as to its thickness and the regrown region of the present device is the region having the high resistivity. The resistivity of this region is on the order of five ohms per centimeter while the resistivity of the remaining portion of the semiconductor body is on the order of 0.1 ohm per centimeter.

Although the construction of a semiconductor diode has been described in the foregoing preferred embodiment of the present invention, it is to be understood that a transistor having similar characteristics may also be constructed by merely performing the same operation on the opposite surface of the semiconductor body and then encapsulating the resulting semiconductor body in any of the conventional semiconductor housings for transistors.

There has thus been disclosed a method for producing a semiconductor body containing a thin fast resistivity region and a high recovery time type semiconductor device constructed in accordance with the method.

What is claimed is:

1. A method for producing fused junction semiconductor bodies having a thin regrown region of relatively high resistivity comprising the steps of: preparing a semiconductor body of one conductivity type containing at least one donor and one acceptor active impurity regularly distributed therethrough and having substantially different segregation constants, the lower segregation constant impurity being predominant, depositing a substantially pure non-doping solvent metal upon one surface of said body, fusing said body and said solvent metal at a temperature above the eutectic temperature of said body and said metal but below the melting point of said body to melt said non-doping solvent metal whereby a portion of said body adjacent thereto along with said active impurities is dissolved, and cooling said body to precipitate at least a portion of said dissolved material upon said body and thereby to form a regrown region therein having a conductivity type opposite to that of said body and a resistivity greater than that of said body.

2. A method for producing fused junction semiconductor bodies having a thin regrown region of relatively high resistivity comprising the steps of: preparing a semiconductor body of one conductivity type containing at least one donor and one acceptor active impurity regularly distributed therethrough and having substantially different segregation constants, the lower segregation constant impurity being predominant, depositing substantially pure gold upon one surface of said body, fusing said body and said gold at a temperature above the eutectic temperature of said body and said gold but below the melting point of said body to melt said gold whereby a portion of said body adjacent thereto along with said active impurities is dissolved, and cooling said body to precipitate at least a portion of said dissolved material upon said body and thereby to form a regrown region therein having a conductivity type opposite to that of said body and a resistivity greater than that of said body.

3. A method for producing semiconductor bodies having a thin regrown region of relatively high resistivity comprising the steps of: preparing an N-type germanium semiconductor body containing at least antimony and boron regularly distributed therethrough and wherein said antimony is predominant, depositing a substantially pure solvent metal upon one surface of said body, fusing said body and said solvent metal at a temperature above the eutectic temperature of said body and said metal but below the melting point of said body to melt said solvent metal whereby a portion of said body adjacent thereto along with said antimony and boron is dissolved, and cooling said body to precipitate at least a portion of said dissolved material upon said body and thereby to form a regrown region therein having a conductivity type opposite to that of said body wherein said boron is predominant.

4. A method for producing fused junction semiconductor bodies having a thin regrown region of relatively high resistivity comprising the steps of: preparing an N type germanium semiconductor body containing at least antimony and boron regularly distributed therethrough and wherein said antimony is predominant, depositing substantially pure gold upon one surface of said body, fusing said body and said gold at a temperature above the eutectic temperature of said body and said gold but below the melting point of said body to melt said gold whereby a portion of said body adjacent thereto along with said antimony and boron is dissolved, and cooling said body to precipitate at least a portion of said dissolved material upon said body whereby a regrown region is formed within said body and in which the dominant active impurity is boron.

5. A method for producing fused junction semiconductor bodies having a thin regrown region of relatively high resistivity comprising the steps of: preparing a semiconductor body of one conductivity type containing at least one donor and one acceptor active impurity regularly distributed therethrough and having substantially different segregation constants, the lower segregation constant impurity being predominant, depositing substantially pure non-doping lead upon one surface of said body, fusing said body and said non-doping lead at a temperature above the eutectic temperature of said body and said lead but below the melting point of said body to melt said non-doping lead whereby a portion of said body adjacent thereto along with said active impurities is dissolved, and cooling said body to precipitate at least a portion of said dissolved material upon said body and thereby to form a regrown region therein having a conductivity type opposite to that of said body and a resistivity greater than that of said body.

6. A fused junction semiconductor device including a semiconductor body of one conductivity type containing at least first and second impurities, said first active impurity having a segregation constant substantially higher than that of the other and said second active impurity being predominant; a regrown region within said body of a conductivity type opposite that of said body including said active impurities and wherein said first active impurity is predominant, and a metallic button affixed to said regrown region, said button consisting of a substantially pure solvent metal and a predominance of atoms of said second active impurity originally present in the semiconductor body.

7. A fused junction semiconductor device including an N-type semiconductor body containing at least first and second active impurities, said active impurities having substantially different segregation constants and said first impurity being predominant; a P-type regrown region within said body including said impurities and having a high resistivity as compared to that of said body wherein said second impurity is predominant, and a metallic button affixed to said regrown region, said button consisting essentially of a substantially pure solvent metal and a predominance of atoms of said first active impurity originally present in the semiconductor body.

8. A fused junction semiconductor device including an N-type semiconductor body containing at least boron and antimony as active impurities distributed therethrough, said antimony being predominant, a P-type regrown region including boron and antimony within said body having a high resistivity as compared to that of said body wherein boron is predominant, and a metallic button affixed to said regrown region, said button consisting of a substantially pure solvent metal and a predominance of atoms of antimony which were originally present in the semiconductor body.

9. A fused junction fast recovery time semiconductor device, including: a semiconductor body containing donor and acceptor type impurities; a regrown region within said body of a conductivity type opposite to that of the adjacent portion of said body; and a metallic button affixed to said regrown region, said button consisting of a substantially pure solvent metal and a predominance of impurity atoms of one of said donor and acceptor types, and said regrown region consisting of a portion of said semiconductor body and a predominance of impurity atoms of the other of said donor and acceptor types and having a relatively high resistivity as compared to the adjacent portion of said semiconductor body.

10. A device according to claim 12 wherein the predominant type impurity in said regrown region has a higher segregation constant than the other of said impurities.

References Cited in the file of this patent

UNITED STATES PATENTS

| | | |
|---|---|---|
| 2,597,028 | Pfann | May 20, 1952 |
| 2,654,059 | Schockley | Sept. 29, 1957 |
| 2,784,121 | Fuller | Mar. 5, 1957 |
| 2,836,523 | Fuller | May 27, 1958 |
| 2,878,148 | Beale | Mar. 17, 1959 |

FOREIGN PATENTS

| | | |
|---|---|---|
| 532,474 | Belgium | Oct. 30, 1954 |

UNITED STATES PATENT OFFICE

CERTIFICATION OF CORRECTION

Patent No. 3,001,894 September 26, 1961

Milton Becker et al.

It is hereby certified that error appears in the above numbered patent requiring correction and that the said Letters Patent should read as corrected below.

Column 1, line 67, for "reproductible" read -- reproducible --; column 4, line 64, for "high" read -- fast --; column 6, line 58, for the claim reference numeral "12" read -- 9 --.

Signed and sealed this 3rd day of April 1962.

(SEAL)
Attest:

ERNEST W. SWIDER
Attesting Officer

DAVID L. LADD
Commissioner of Patents